United States Patent [19]

Sezi et al.

[11] Patent Number: 5,733,706
[45] Date of Patent: Mar. 31, 1998

[54] DRY-DEVELOPABLE POSITIVE RESIST

[75] Inventors: Recai Sezi, Röttenbach; Rainer Leuschner, Erlangen; Horst Borndörfer, Penzberg; Eva-Maria Rissel, Forchheim; Michael Sebald, Weisendorf; Hellmut Ahne, Röttenbach; Siegfried Birkle, Höchstadt; Eberhard Kühn, Hemhofen, all of Germany

[73] Assignee: Siemens Aktiengesellschaft, München, Germany

[21] Appl. No.: 737,989

[22] PCT Filed: May 11, 1995

[86] PCT No.: PCT/DE95/00626

§ 371 Date: Nov. 25, 1996

§ 102(e) Date: Nov. 25, 1996

[87] PCT Pub. No.: WO95/32455

PCT Pub. Date: Nov. 30, 1995

[30] Foreign Application Priority Data

May 25, 1994 [DE] Germany ............ 44 18 205.8

[51] Int. Cl.⁶ .................................... G03C 1/73
[52] U.S. Cl. .................... 430/270.1; 430/281.1; 430/914
[58] Field of Search ............... 430/281.1, 270.1, 430/326, 914

[56] References Cited

U.S. PATENT DOCUMENTS

| | | | |
|---|---|---|---|
| 5,023,164 | 6/1991 | Brunsvold et al. | 430/270 |
| 5,229,258 | 7/1993 | Sezi et al. | 430/325 |
| 5,262,283 | 11/1993 | Sezi et al. | 430/375 |
| 5,296,332 | 3/1994 | Sachdev et al. | 430/270 |
| 5,384,220 | 1/1995 | Sezi et al. | 430/8 |
| 5,399,604 | 3/1995 | Sano et al. | 524/356 |

FOREIGN PATENT DOCUMENTS

| | | |
|---|---|---|
| 0 102 450 | 5/1983 | European Pat. Off. . |
| 0 136 130 | 9/1984 | European Pat. Off. . |
| 0 161 476 | 4/1985 | European Pat. Off. . |
| 0 192 078 | 1/1986 | European Pat. Off. . |
| 0 204 253 | 5/1986 | European Pat. Off. . |
| 0 229 917 | 11/1986 | European Pat. Off. . |
| 0 248 779 | 5/1987 | European Pat. Off. . |
| 0 281 182 | 2/1988 | European Pat. Off. . |
| 0 307 752 | 9/1988 | European Pat. Off. . |
| 0 352 739 | 7/1989 | European Pat. Off. . |
| 0 451 311 | 4/1990 | European Pat. Off. . |
| 0 453 610 | 4/1990 | European Pat. Off. . |
| 0 492 256 | 12/1991 | European Pat. Off. . |
| 6-250 390 | 1/1990 | Japan . |

OTHER PUBLICATIONS

Babich, E. et al., "A Comparison of the Electron Beam Sensitivities and Relative Oxygen Plasma Etch Rates of Various Organosilicon Polymers," *Microelectronic Engineering* 3, (1985), pp. 279–291.

Hiraoka, Hiroyuki, "Positive–Tone Polymer Images by Surface Modification in Ion Beam Exposures," *Materials Research Society Symp. Proc.*, (1985) IBM Research Laboratory, San Jose, CA, pp. 197–202.

Reck, B. et al., "Novel Photoresist Design Based on Electrophilic Aromatic Substitution," pp. 63–72.

Crivello, J.V., "Novel Negative Working Photoresists," *J. Electrochem. Soc.*, vol. 136, No. 5 (1989), pp. 1453–1456.

Gogolides, E. et al., "Wet Silyation and Dry Development with the AZ 5214™ Photoresist," *J. Vac. Sci. Technol. B.* (1992), pp. 2610–2614.

*Primary Examiner*—Janet C. Baxter
*Assistant Examiner*—Rosemary Ashton
*Attorney, Agent, or Firm*—Kenyon & Kenyon

[57] ABSTRACT

A dry-developable, positively acting TSI resist contains the following components:
- a suitable solvent,
- a strong acid former as the photoactive component, and
- a base polymer in the form of a copolymer or terpolymer with maleic acid anhydride as a basic unit and glycidyl methacrylate and/or a styrene derivative as a further basic unit, and possibly an additive.

20 Claims, No Drawings

DRY-DEVELOPABLE POSITIVE RESIST

BACKGROUND OF THE INVENTION

The invention relates to a dry-developable, positively acting TSI resist.

In photolithographic structure production, dry-developable TSI single layer resists (TSI=Top Surface Imaging) demonstrate a number of advantages, such as suppression of reflections and reduction of topography effects. A detailed description of such systems is found in "Introduction to Microlithography," ACS Symposium Series 219 (1983), pages 287 to 350.

TSI resists are known both in the form of positively acting and in the form of negatively acting dry-developable single layer systems. In contrast to negatively acting systems, positively acting TSI systems are much better suited for applications in the contact hole planes, which are very critical, because of their lesser defect density.

Dry-developable single layer systems function according to the following principle:

application of the resist to a silicon wafer and drying;

exposure and, if necessary, heating, in order to produce a "latent" image;

treatment with a metallization agent, for example an organometal compound, causing the resist—in the exposed areas (negative resist) or in the non-exposed areas (positive resist)—to become resistant to dry developing, particularly in an oxygen plasma;

dry developing.

This number of process steps should not be exceeded in production, if possible.

A high-resolution TSI system which is well suited for production should furthermore satisfy the following requirements:

1. Easy and line-compatible processing More process steps than the ones mentioned above result in higher costs, with the additional costs being caused by investments for additional equipment and/or reagents, and by the additional process steps.

2. High level of sensitivity The lower the sensitivity, the lower the throughput of the expensive exposure equipment (steppers), and therefore the higher the costs. A high level of sensitivity in the DUV range (DUV=deep UV) is particularly important.

3. High resistance to plasma development A high resistance of the regions treated with the metallization agent is important for a high process latitude in dry developing.

In order to solve the problem of low DUV sensitivity of photoresists, resist systems were developed which have tert. butyl ester or tert. butoxy carbonyloxy groups in the basic polymer (see in this regard EP-OS 0 102 450 and 0 161 476, i.e. the corresponding U.S. Pat. Nos. 4,491,628 and 4,552, 833). When exposed in the presence of a strong acid former, for example a Crivello salt, carboxyl groups or phenolic OH groups are formed, with a single proton splitting off several groups, according to the principle of so-called "chemical amplification" (see, for example, "J. Electrochem. Soc.," Vol. 136 (1989), pages 1453 to 1456).

Cationic polymerization or crosslinking can also be carried out by catalysis with strong acids; these are suitable for use in resist systems with high DUV sensitivity. A negative TSI resist which is very sensitive in the DUV range and functions according to the principle of acid-catalyzed polymerization is described, for example, in EP-OS 0 192 078, i.e. in the corresponding U.S. Pat. No. 4,551,418. Reports about the use of acid-catalyzed crosslinking in photoresist systems, for example by means of etectrophilic substitution on activated aromatics in the presence of Crivello salts, were presented at the 8th international Conference on Photopolymers, Ellenville, N.Y. (1988) (see Conference report: pages 63 to 72).

Also, several positively acting TSI systems have already become known, but they do not fully meet the above requirements in each instance:

EP-OS 0 136 130

Using the method described, positive and negative structures can be produced with UV light or with electron beams. A disadvantage is the need for special apparatus (for vacuum) as well as the requirement of metallization with corrosive or toxic gases, such as $B_2H_6$, $SiCl_4$, and $TiCl_4$, which is not very suitable for production.

EP-OS 0 204 253 (i.e. U.S. Pat. No. 4,613,398)

Positively acting and negatively acting systems are described, where the permeability of the resist relative to the metallization agent is changed by the exposure. Disadvantages of this system in the positive mode are a low level of DUV sensitivity (50 to 300 mJ/cm$^2$) and the requirement of silylation with hexamethyl cyclotrisilazane in o-xylene at 65° C., for which special apparatus is required, resulting in low line compatibility.

EP-OS 0 229 917 (i.e. U.S. Pat. No. 4,657,845)

A method is described which is based on the principle of chemical amplification and has a high level of DUV sensitivity (approximately 6 mJ/cm$^2$). However, two additional process steps are needed, namely metal-free treatment with methyl isocyanate, in a vacuum oven, as well as flood exposure.

EP-OS 0 248 779

The method described makes do with few process steps, but a special apparatus for gas phase silylation at an elevated temperature is required.

EP-OS 0 281 182 and EP-OS 0 352 739 (i.e. U.S. Pat. No. 4,921,778)

The systems described demonstrate good DUV sensitivity, but they have the disadvantage that special apparatus is required for silylation from the gas phase, at an elevated temperature. In addition, the silylated regions demonstrate only moderate etching resistance, due to the inclusion of monomer silicon fragments, such as $Si(CH_3)_3$ groups (see also in this regard: "Microelectronic Engineering," Vol. 3 (1985), pages 279 to 291).

"Mat. Res. Soc. Symp. Proc.," Vol. 45 (1985), pages 197 to 202, as well as "IBM Techn. Discl. Bull.," Vol. 27, No. 4A (1984), page 2197

The method described is based on the decarboxylation of homopolymers and copolymers of (meth)acrylic acid, and possibly its anhydride, by means of energy-rich rays and silylation of the non-exposed regions from the gas phase. The disadvantages consist of the gas phase silylation (need for special equipment), the relatively low etching resistance in oxygen plasma (because of silylation with hexamethyl disilazane), and the lower DUV sensitivity of a decarboxylation reaction of the type indicated.

"J. Vac. Sci. Technol. B," Vol. 10 (1992), pages 2610 to 2614

The silylation of resists based on Novolak, from the liquid phase, with hexamethyl cyclotrisilazane, is described.

However, this silylation reagent requires special closed apparatus, because of its sensitivity to moisture. In addition, the Novolak resists used have OH groups which are silylated forming O-Si bonds. The etching resistance of such systems is comparatively low.

Furthermore, a structuring method with dry development was already proposed which produces positive images, where subhalfmicron structures can be produced, using usual apparatus (se EP-OS 0 451 311, i.e. the corresponding U.S. Pat. No. 5,229,258). However, this method includes two additional process steps, namely treatment of the exposed photoresist layer with a polyfunctional organic compound, particularly a polyamine, and flood exposure.

From EP-OS 0 492 256, a method for photolithographic structure production in the submicron range, i.e. a dry-developable TSI resist system suitable for that is known. For this purpose, a photoresist layer consisting of a polymer containing carboxylic acid anhydride and carboxylic acid tert. butyl ester groups, of a photoinitiator which releases an acid upon exposure, and of a suitable solvent, is applied to a substrate. The photoresist layer is then dried and exposed patternwise, and the exposed layer is subjected to temperature treatment. The temperature treatment is conducted in such a way that the photoresist becomes hydrophilic in the exposed regions. Subsequently, the photoresist layer treated in this way is subjected to liquid silylation, and the silylated layer is dry-developed in an anisotropic oxygen plasma. The known TSI resist system has a high etching resistance and good sensitivity, but wetting problems can occur in the treatment with the silylation solution, specifically in silylation with non-polar, aprotic media, i.e. in the positive mode.

SUMMARY OF THE INVENTION

It is the task of the invention to make available a dry-developable, positively acting TSI resist for the subhalfmicron range, which is easy to process and is particularly sensitive for DUV rays, which demonstrates a high etching resistance of the metallized regions to dry development. In particular, the TSI resist is supposed to allow carrying out the metallization process at room temperature and at room humidity, as well as at normal pressure, without the use of special apparatus.

This is achieved, according to the invention, by a resist which contains the following components:

a suitable solvent, a strong acid former as the photoactive component, and a base polymer in the form of a copolymer or terpolymer with maleic acid anhydride as a basic unit and glycidyl methacrylate and/or a styrene derivative with the following structure as a further base unit:

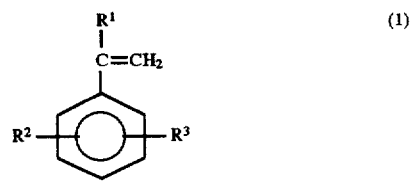

(1)

where $R^1$=H or $CH_3$,
$R^2$=H or $R^3$,
$R^3$=$(CH_2)_m$—OX,
where X has the following significance:
$(CH_2)_a$—$CH_3$, CO—$(CH_2)_c$—$CH_3$,
or CO—$(CH_2)_d$—O—$(CH_2)_e$—$CH_3$,
and m, a, c, d, and e—independent of one another—each stand for a whole number from 0 to 5, wherein
when m=0, the basic polymer includes an additive with the following structure:

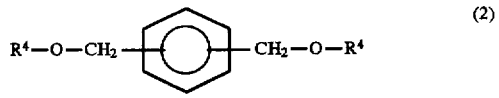

(2)

where $R^4$=CO—$(CH_2)_n$—$CH_3$ or CO—$C_6H_5$
where n stands for a whole number from 0 to 5.

DETAILED DESCRIPTION OF THE INVENTION

In the positive resist according to the invention, it is essential that the base polymer is composed of at least two different basic units, i.e. that at least two different functional groups are present. These functional groups are carboxylic acid anhydride groups, on the one hand, and epoxy groups or aromatic groups of the type described above, on the other hand. The anhydride groups serve to form a chemical bond during silylation, the epoxy groups or aromatic groups ensure acid-catalyzed crosslinking in the DUV range.

Therefore, maleic acid anhydride, on the one hand, and either glycidyl methacrylate or a styrene derivative with the structure (1), on the other hand, serve as basic units for the base polymer. If the styrene derivative does not possess any $(CH_2)_m$—OX groups with m≧1, then the resist composition additionally contains an additive with the structure (2). This additive, which is preferably p-bis(acetoxymethyl) benzene, can also be present, however, if the styrene derivative has a group of the type stated.

The base polymer can be a copolymer or a terpolymer. In the first case, a copolymer of maleic acid anhydride and glycidyl methacrylate or of maleic acid anhydride and a styrene derivative of the type stated is present. In the second case, a third basic unit is added, which can be maleic acid or styrene, for example. However, the terpolymer can also be composed of maleic acid anhydride, glycidyl methacrylate, and a styrene derivative of the type stated.

The photoactive component in the TSI resist according to the invention is a strong acid former, i.e. a compound which forms a strong acid when exposed. So-called Crivello salts particularly serve for this purpose. These are onium compounds such as diphenyl iodonium triflate and triphenyl sulfonium triflate ("triflate" is the trifluoromethane sulfonyl residue). However, general photoactive sulfonic acid formers can be used. The photoactive component is generally used in an amount of 0.5 to 5% by mass, with reference to the resist composition.

Solvents that are generally known are used as solvents for the photoresist according to the invention. Preferably, the resist solvent is methoxypropyl acetate or diethylene glycol dimethyl ether; in addition, cyclohexanone can also be used, for example. Only the requirement that both the base polymer and the photoactive component as well as the additive, if applicable, must be dissolved is important for the selection of the solvent.

In photostructuring of the TSI resist according to the invention, only the minimum number of process steps is required. After application of the resist to the substrate, and drying, exposure takes place through a mask, then tempering takes place. This results in acid-catalyzed crosslinking of the exposed regions, so that penetration of the silylation solution into these regions is prevented during the subsequent silylation step, and the non-exposed regions are selectively silylated. Oligomeric bisaminosiloxanes serve as the silylation reagent. A high degree of plasma etching resistance during dry developing is achieved with such compounds. Silylation itself is carried out in the usual spray or puddle development apparatus, at room temperature and room humidity, as well as at normal pressure. After silylation, dry development takes place in an anisotropic oxygen plasma. In this connection, it turns out that the etching resistance of the silylated resist regions to the oxygen plasma is very high. After dry development, subhalfmicron structures with steep sidewalls are obtained.

The invention will be explained in more detail on the basis of exemplary embodiments. In this connection, the following starting materials and reagents are used (MP=parts by mass):

Base polymer (1):
  Copolymer of maleic acid anhydride and 4—(acetoxymethyl) styrene, produced by radical polymerization of the monomers with azoisobutyric acid nitrile as the initiator.

Base polymer (2):
  Terpolymer of maleic acid anhydride, 4-(acetoxymethyl) styrene, and maleic acid, produced by radical polymerization of the monomers with azoisobutyric acid nitrile as the initiator.

Base polymer (3):
  Copolymer of maleic acid anhydride and glycidyl methacrylate, produced by radical polymerization of the monomers with azoisobutyric acid nitrile as the initiator.

Base polymer (4):
  Copolymer of maleic acid anhydride and p-methoxy styrene, produced by radical polymerization of the monomers with azoisobutyric acid nitrile as the initiator.

Photoactive component (1):
  Triphenyl sulfonium trifluoromethane sulfonate

Photoactive component (2):
  Diphenyl iodonium trifluoromethane sulfonate

Additive (1):
  p-bis (acetoxymethyl) benzene

Silylation solution (1):
  Aqueous organic solution, consisting of 8 MP diaminosiloxane (Tegomer A-Si 2120, Goldschmidt), 61.3 MP isopropanol, 18.4 MP diethylene glycol dimethyl ether, and 12.3 MP water.

Silylation solution (2):
  Aqueous organic solution, consisting of 8 MP diaminosiloxane, 51 MP isopropanol, 26 MP ethanol, and 15 MP water.

Silylation solution (3):
  Organic solution, consisting of 5 MP diaminosiloxane, 76 MP isopropanol, and 19 MP diethylene glycol dimethyl ether.

Silylation solution (4):
  Aqueous organic solution, consisting of 8 MP diaminosiloxane, 69 MP isopropanol, 9.2 MP diethylene glycol dimethyl ether, and 13.8 MP water.

EXAMPLE 1

A resist consisting of 23.25 MP base polymer (1), 1.75 MP photoactive component (1), and 75 MP methoxypropyl acetate is centrifuged onto a silicon wafer and dried at 100° C. for 60 s on a hot plate; the layer thickness of the resist is 1.2 µm. The resist is then contact-exposed through a mask at 6.8 mJ/cm² (equipment MJB 3, Karl Süss; exposure wavelength λ=250 nm) and tempered at 140° C. for 90 s. After cooling, the resist is treated with silylation solution (1) in a puddle development apparatus (Type CEM 2000, Convac), at room temperature and room humidity, as well as normal pressure, for 75 s, and then rinsed with isopropanol for 30 s and dried. After drying, the wafer is placed in a plasma etching system (Type MIE 720, Material Research Corporation), and the resist is dry-developed in the oxygen plasma ($O_2$/RIE: 1.8 mTorr gas pressure, 30 sccm gas flow, 50 V bias voltage, 1.2 kW output, with magnet). Positive structures up to 0.4 µm with a line/space ratio of 1:1 are obtained.

EXAMPLE 2

A resist consisting of 21.4 MP base polymer (2), 1.6 MP photoactive component (1), and 77 MP methoxypropyl acetate is centrifuged onto a silicon wafer and dried at 100° C. for 60 s on a hot plate; the layer thickness of the resist is 1.2 µm. The resist is then contact-exposed through a mask at 7 mJ/cm² (equipment MJB 3, Karl Süss; exposure wavelength λ=250 nm) and tempered at 140° C. for 90 s. After cooling, the resist is treated with silylation solution (2) in a puddle development apparatus (Type CEM 2000, Convac), at room temperature and room humidity, as well as normal pressure, for 90 s, and then rinsed with isopropanol for 30 s and dried. After drying, the resist is dry-developed in a plasma etching system (Type MIE 720, Material Research Corporation), in an oxygen plasma—corresponding to Example 1. Positive structures up to 0.4 µm with a line/space ratio of 1:1 are obtained.

EXAMPLE 3

A commercially available photoresist based on Novolak is centrifuged onto a silicon wafer (as the substrate) and dried at 90° C. for 1 min, on a hot plate. After being heated in a circulating air oven (240° C., 35 min), the thickness of the resist, which serves as a planarization layer, is 1.3 µm.

A resist consisting of 13.95 MP base polymer (3), 1.05 MP photoactive component (2), and 85 MP diethylene glycol dimethyl ether is centrifuged onto the planarization layer. After drying at 90°/60 s on a hot plate, the layer thickness of this top resist is 0.35 µm. The resist is then contact-exposed through a mask at 5.5 mJ/cm² (equipment MJB 3, Karl Süss; exposure wavelength λ=250 nm) and tempered at 110° C. for 60 s. After cooling, the resist is treated with silylation solution (3) in a puddle development apparatus (Type CEM 2000, Convac), at room temperature and room humidity, as well as normal pressure, for 60 s, and then rinsed with isopropanol for 30 s and dried. After drying, the wafer is placed in a plasma etching system (Type MIE 720, Material Research Corporation), and the resist is dry-developed in the oxygen plasma ($O_2$/RIE: 1.8 mTorr gas pressure, 30 sccm gas flow, 40 V bias voltage, 0.9 kW output, with magnet). Positive structures up to 0.4 µm with vertical sidewalls and a line/space ratio of 1:1 are obtained.

EXAMPLE 4

A resist consisting of 13.6 MP base polymer (4), 5.0 MP additive (1), 1.4 MP photoactive component (1), and 80 MP methoxypropyl acetate is centrifuged onto a silicon wafer and dried at 90° C. for 60 s on a hot plate; the layer thickness of the resist is 1.3 µm. The resist is then contact-exposed through a mask at 7.5 mJ/cm² (equipment MJB 3, Karl Süss; exposure wavelength λ=250 nm) and tempered at 110° C. for 60 s. After cooling, the resist is treated with silylation solution (4) in a puddle development apparatus (Type CEM 2000, Convac), at room temperature and room humidity, as well as normal pressure, for 45 s, and then rinsed with isopropanol for 30 s and dried. After drying, the resist is dry-developed in a plasma etching system (Type MIE 720, Material Research Corporation), in an oxygen plasma—in accordance with Example 1. Positive structures up to 0.4 μm with vertical sidewalls and a line/spce ratio of 1:1 are obtained.

EXAMPLE 5

A resist corresponding to Example 1 is applied to a silicon wafer in the manner described there, and dried. Subsequently—in corresponding manner—it is treated with silylation solution (1) in a puddle development apparatus for 75 s, then rinsed with isopropanol for 30 s and dried. After drying, the wafer is placed in a plasma etching system (Type MIE 720, Material Research Corporation), and the resist is dry-etched in the oxygen plasma, for 200 s ($O_2$/RIE: 1.8 mTorr gas pressure, 30 sccm gas flow, 50 V bias voltage, 0.9 kW output, with magnet). From layer thickness measurements before and after etching, an erosion rate of the silylated layer of 0.83 nm/s is calculated.

EXAMPLE 6

A resist corresponding to Example 3 is applied to a silicon wafer in the manner described there, and dried. Subsequently—in corresponding manner—it is treated with silylation solution (3) in a puddle development apparatus for 60 s, then rinsed with isopropanol for 30 s and dried. After drying, the wafer is placed in a plasma etching system (Type MIE 720, Material Research Corporation), and the resist is dry-etched in the oxygen plasma, for 200 s ($O_2$/RIE: 1.8 mTorr gas pressure, 30 sccm gas flow, 50 V bias voltage, 0.9 kW output, with magnet). From layer thickness measurements before and after etching, an erosion rate of the silylated layer of 0.78 nm/s is calculated.

What is claimed is:

1. A dry-developable positively acting top surface imaging resist comprising:

a solvent, a strong acid former as a photoactive component, and a base polymer in the form of a copolymer or terpolymer with maleic acid anhydride as a basic structural unit and glycidyl methacrylate or a styrene derivative with the following structure as a further basic structural unit or in the form of a terpolymer of maleic acid anhydride, maleic acid and a styrene derivative with the following structure:

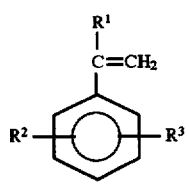

where
$R^1$=H or $CH_3$,
$R^2$ =H or $R^3$,
$R^3$ =$(CH_2)_m$—OX,
where X has the following significance:
$(CH_2)_a$—$CH_3$, CO—$(CH_2)_c$—$CH_3$, or
CO—$(CH_2)$d—O—$(CH_2)_e$—$CH_3$, and m, a, c, d, and e—independent of one another—each stand for a whole number from 0 to 5, wherein when m=0, the base polymer includes an additive with the following structure:

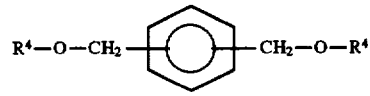

where $R^4$=CO—$(CH_2)$n—$CH_3$ or CO—$C_6H_5$ where n stands for a whole number from 0 to 5.

2. The resist according to claim 1, wherein the base polymer is a copolymer of maleic acid anhydride and glycidyl methacrylate.

3. The resist according to claim 2, wherein the photoactive component is an onium salt.

4. The resist according to claim 2, wherein the solvent is selected from the group consisting of methoxypropyl acetate and diethylene glycol dimethyl ether.

5. The resist according to claim 1, wherein the base polymer is a copolymer of maleic acid anhydride and 4-(acetoxymethyl) styrene.

6. The resist according to claim 5, wherein the photoactive component is an onium salt.

7. The resist according to claim 5, wherein the solvent is selected from the group consisting of methoxypropyl acetate and diethylene glycol dimethyl ether.

8. The resist according to claim 1, wherein the base polymer is a terpolymer of maleic acid anhydride, 4-(acetoxymethyl) styrene, and maleic acid.

9. The resist according to claim 8, wherein the photoactive component is an onium salt.

10. The resist according to claim 8, wherein the solvent is selected from the group consisting of methoxypropyl acetate and diethylene glycol dimethyl ether.

11. The resist according to claim 1, wherein the base polymer is a copolymer of maleic acid anhydride and p-methoxy styrene.

12. The resist according to claim 11, including p-bis(acetoxymethyl)benzene as an additive.

13. The resist according to claim 12, wherein the solvent is selected from the group consisting of methoxypropyl acetate and diethylene glycol dimethyl ether.

14. The resist according to claim 11, wherein the photoactive component is an onium salt.

15. The resist according to claim 11, wherein the solvent is selected from the group consisting of methoxypropyl acetate and diethylene glycol dimethyl ether.

16. The resist according to claim 1, wherein the photoactive component is an onium salt.

17. The resist according to claim 16, wherein the photoactive component is at least one of diphenyl iodonium trifluoromethane sulfonate and triphenyl sulfonium trifluoromethane sulfonate.

18. The resist according to claim 16, wherein the solvent is selected from the group consisting of methoxypropyl acetate and diethylene glycol dimethyl ether.

19. The resist according to claim 1, wherein the solvent is selected from the group consisting of methoxypropyl acetate and diethylene glycol dimethyl ether.

20. A dry-developable positively acting top surface imaging resist comprising:

a solvent, a strong acid former as a photoactive component, and a base polymer in the form of a copolymer or terpolymer with maleic acid anhydride as a basic structural unit and glycidyl methacrylate or a styrene derivative with the following structure as a further basic structural unit or in the form of a terpolymer of maleic acid anhydride, maleic acid and a styrene derivative with the following structure:

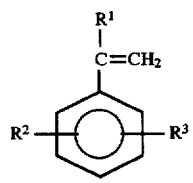

where
R$^1$=H or CH$_3$,
R$^2$=H or R$^3$,
R$^3$=(CH$_2$)$_m$—OX,
where x has the following significance:
(CH$_2$)$_a$—CH$_3$, CO—(CH$_2$)$_c$—CH$_3$, or CO—(CH$_2$)$_d$—O—(CH$_2$)$_e$—CH$_3$, and m, a, c, d, and e—independent of one another—each stand for a whole number from 0 to 5, wherein the base polymer includes an additive with the following structure:

where R$^4$=CO—(CH$_2$)$_n$—CH$_3$ or CO—C$_6$H$_5$ where n stands for a whole number from 0 to 5.

* * * * *